United States Patent
Choong

(10) Patent No.: US 7,504,770 B2
(45) Date of Patent: Mar. 17, 2009

(54) ENHANCEMENT OF LIGHT EXTRACTION WITH CAVITY AND SURFACE MODIFICATION

(75) Inventor: Vi-En Choong, San Jose, CA (US)

(73) Assignee: Osram Opto Semiconductors GmbH, Regensberg (DE)

( * ) Notice: Subject to any disclaimer, the term of this patent is extended or adjusted under 35 U.S.C. 154(b) by 634 days.

(21) Appl. No.: 11/054,997

(22) Filed: Feb. 9, 2005

(65) Prior Publication Data

US 2006/0175961 A1    Aug. 10, 2006

(51) Int. Cl.
*H05B 33/00* (2006.01)
*H05J 9/00* (2006.01)

(52) U.S. Cl. .................. 313/504; 313/506; 313/112; 445/23; 427/66

(58) Field of Classification Search .................. None
See application file for complete search history.

(56) References Cited

U.S. PATENT DOCUMENTS

| | | | | |
|---|---|---|---|---|
| 5,834,893 A | * | 11/1998 | Bulovic et al. | 313/506 |
| 6,046,543 A | * | 4/2000 | Bulovic et al. | 313/504 |
| 2004/0239832 A1 | * | 12/2004 | Saito | 349/74 |
| 2005/0104075 A1 | * | 5/2005 | Evans et al. | 257/83 |
| 2005/0276299 A1 | * | 12/2005 | Kondo | 372/50.23 |
| 2007/0036189 A1 | * | 2/2007 | Hori et al. | 372/50.11 |
| 2007/0159086 A1 | * | 7/2007 | Yu et al. | 313/506 |
| 2007/0263687 A1 | * | 11/2007 | Takahashi et al. | 372/45.01 |

* cited by examiner

*Primary Examiner*—Ashok Patel
(74) *Attorney, Agent, or Firm*—Fish & Richardson P.C.

(57) ABSTRACT

An organic light emitting diode (OLED) device includes an anode layer upon a DBR (Distributed Bragg Reflector) stack such that the anode layer is modified by creating lens-like features on its surface. The OLED device also includes a planarizing layer on said anode layer, said planarizing layer filling in said lens-like features, said planarizing layer providing a flat uniform surface for the deposition of other layers thereupon.

23 Claims, 4 Drawing Sheets

ENHANCEMENT OF LIGHT EXTRACTION WITH CAVITY AND SURFACE MODIFICATION

BACKGROUND

1. Field of the Invention

This invention relates generally to the art of thin film device processing and fabrication. More specifically, the invention relates to the fabrication of Organic Light Emitting Diode devices and displays.

2. Related Art

Display and lighting systems based on LEDs (Light Emitting Diodes) have a variety of applications. Such display and lighting systems are designed by arranging a plurality of photo-electronic elements ("elements") such as arrays of individual LEDs. LEDs that are based upon semiconductor technology have traditionally used inorganic materials, but recently, the organic LED ("OLED") has come into vogue for certain lighting and display applications. Examples of other elements/devices using organic materials include organic solar cells, organic transistors, organic detectors, biochips, and organic lasers.

An OLED is typically comprised of two or more thin at least partially conducting organic layers (e.g., an anode buffer layer (ABL) which transports holes and an emissive layer (EL) which emits light upon hole-electron recombination therein) which are sandwiched between two electrodes, an anode and a cathode. Under an applied potential, the anode injects holes into the ABL which then transports them to the EL, while the cathode injects electrons directly to the EL. The injected holes and electrons each migrate toward the oppositely charged electrode and recombine to form exciton in the EL. The exciton relaxes to a lower energy state by emission of radiation and in process, emits light. The anode is usually fabricated over a substrate. In a bottom-emitting OLED, the substrate is made transparent or nearly transparent to allow light to output from the device.

The light output of OLED devices can be fine-tuned by the use of micro-cavity structures such as a DBR (Distributed Bragg Reflector). The DBR consists of a stack of sub-layers, with each sub-layer having a different refractive index than its adjacent neighbors. The DBR stack also provides internal reflectivity of varying degree depending upon the length of the DBR stack, the materials used, and the angles of incidence of light into those materials. In a bottom-emitting OLED device, the DBR stack is typically designed to be between the substrate and the anode. Typically, a DBR stack designed to enhance a specific wavelength will amplify light at that resonant wavelength resulting in a narrowing of the spectral emission (the bandwidth) and increase in luminance at the resonant wavelength. Additional effects of a DBR include a focusing of light in to the forward viewing angle cone, thus reducing losses due to trapped light in the substrate by improving the out-coupling of light. Other methods that have been used to improve the out-coupling of light are surface modifications on the outside of the substrate glass which are specifically designed to reduce internal reflections, such as lenses. However, since the DBR already channels light into the forward viewing angle effectively, the addition of lenses on the outside of the substrate provides no extra benefit.

Thus, there is a need for an OLED device structure where the light out-coupling can be further improved.

DETAILED DESCRIPTION OF THE INVENTION

According to some embodiments of the invention, a DBR stack is utilized together with a surface modified anode layer to fabricate an OLED device. The surface modification creates lens like features on the top of the anode layer such that the angle of incidence of light from the emissive layer into the DBR stack is modified. Lens like features are defined as any feature that serves to focus/direct the light in the desired direction. It can be random or ordered, and may look like actual lenses. To maintain integrity of the organic layers of the OLED above the surface modified anode, a planarizing layer can also be provided between the surface modified anode layer and the organic layers so that a more uniform deposition surface is available for the organic layers. The surface modification of the anode layer can be accomplished by any appropriate patterning or deposition techniques such as wet-etching, lithography, e-beam lithography, stamping, or sputtering. The shape and pattern of the surface modification can be designed to enhance light output as desired including random features obtained from simple roughening of a surface. Alternatively, the top layer of the DBR stack can be surface modified, then a planarizing layer is deposited before deposition of the anode. Also, the anode may act as the planarizing layer as well.

Figure 1:
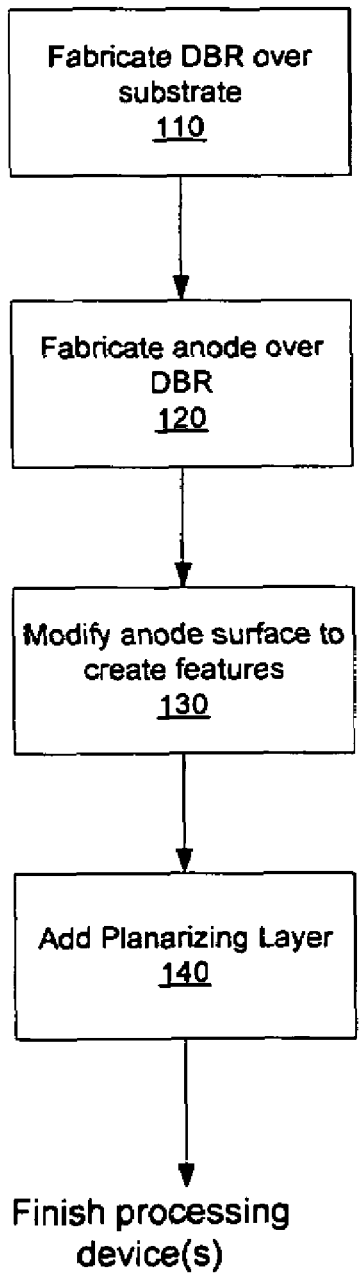
FIG. 1 illustrates a partial process flow for fabricating an ABL according to at least one embodiment of the invention.

FIG. 1 illustrates a partial process flow for fabricating an OLED device according to at least one embodiment of the invention. First a DBR (Distributed Bragg Reflector) is fabricated over the substrate of the OLED device (block 110). The DBR includes a stack of sub-layers with specifically designed indices of refraction which together form a resonant cavity. The art of designing and fabricating DBR stacks is well-known and will not be discussed in detail. The anode layer is fabricated over the DBR stack. Materials, thicknesses and methods of fabrication for the anode layer are discussed below with respect to FIG. 2. Typically, in an OLED device, the anode layer is made from ITO (Indium Tin Oxide) which is transparent and allows light to pass thru from the emissive layer of the device.

In accordance with the invention, the anode layer once deposited is subjected to surface modification (block 130) to create lens-like features on its surface. The surface modification may be performed during and as an intended side effect of deposition. Particularly, for instance, the deposition may involve a sputtering or evaporation technique. The pattern of the sputtering or evaporation can be designed so that the resultant anode surface is rough and uneven and exhibiting the desired features. In some embodiments of the invention, the anode can be fabricated in a typical fashion such that the anode is to be flat and have a uniform thickness throughout.

Then, the surface may be modified by ablation, cutting, scratching and similar techniques. The ablation or scratching will create a rough and uneven surface and hence, features. Since the anode is typically designed in a bottom-emitting OLED to be transparent or semi-transparent, the features will create a lens-like effect upon any light that passes through them. The pattern of the features can be regular and repeating or can be random, depending upon the desired feature size, shape and desired optical properties of the features.

After the anode, the typical OLED has one or more organic layers such as charge transport layer(s), charge injection layer(s), and emissive layer(s). These organic layers are deposited either through solution processible methods such as spin coating, and ink jet, or through vapor deposition techniques such as evaporation, sublimation, etc. In the case of solution spin coating, these organic layers are fabricated by depositing a solution onto the preceding layer and allowing/ causing to dry and harden into a film. The electrical characteristics (efficiency and so on) of these layers is highly dependent on maintaining structural integrity of the films and also, a precise and ordered drying pattern and uniformity of film thickness. However, if the anode surface is modified to create protruding features, this may be difficult to achieve. In order to provide a flat deposition surface for drying an organic film, a planarizing layer is added (block 140) on the surface-modified anode. The planarizing layer can be formed by depositing a solution, resin or material which includes the organic material used for hole injection that will fill-in the features of the surface-modified anode and additionally provide a flat surface above the anode. With a planarizing layer thus provided, it would then be possible to finish processing the OLED device/display. Particularly, the presence of the planarizing layer provides a flat deposition surface for any organic solution that is deposited next.

Figure 2:
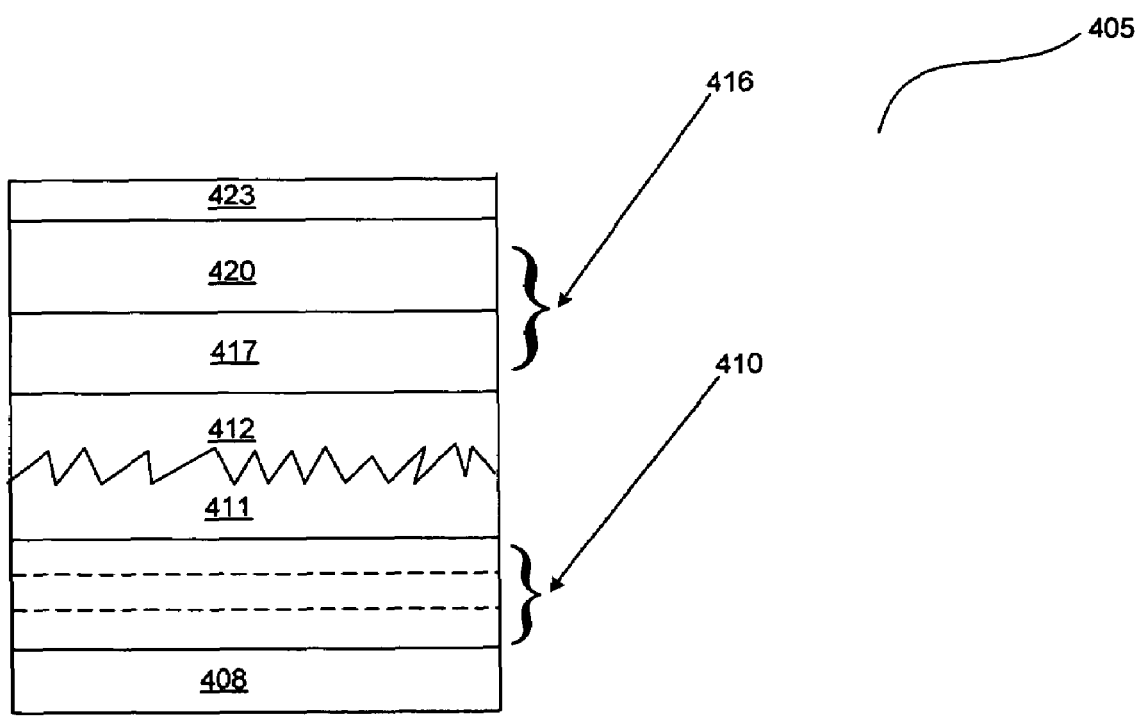
FIG. 2 shows a cross-sectional view of an embodiment of an OLED device 405 according to at least one embodiment of the invention.

FIG. 2 shows a cross-sectional view of an embodiment of an OLED device 405 according to at least one embodiment of the invention. The OLED device 405 may represent one OLED pixel or sub-pixel of a larger OLED display. OLED device 405 is a passive-matrix device since it does not contain its own switching mechanism as with active matrix devices. As shown in FIG. 2, the OLED device 405 includes a DBR Stack 410 on a substrate 408. A first electrode 411 is fabricated on the DBR stack 410 as shown. As used within the specification and the claims, the term "on" includes when layers are in physical contact or when layers are separated by one or more intervening layers. The first electrode 411 may be patterned for pixilated applications or unpatterned for backlight applications.

One or more organic materials is deposited into the aperture to form one or more organic layers of an organic stack 416. In accordance with the invention, the organic stack 416 is on a planarizing layer 412 which is on the first electrode 411. The organic stack 416 includes a hole injection layer ("HIL") 417 and electro-luminescent (EL) layer 420. If the first electrode 411 is an anode, then the HIL 417 is on the planarizing layer 412. Other layers than that shown in FIG. 1 may also be added including barrier, charge transport, charge injection, planarizing, diffracting, and interface layers between or among any of the existing layers as desired. Some of these layers, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. A single substrate 408 is typically used to construct a larger OLED display containing many pixels such as OLED device 405 which are then arranged in some pattern.

DBR Stack 410

DBR stack 410 includes a plurality of layers of substantially non-absorbing materials of appropriately chosen thickness. In one configuration, the layers of DBR stack 410 are alternating pairs of high (refractive) index and low (refractive) index thin-films. In another configuration, the DBR stack 410 is comprised of alternating layers of high index and low index thins films and the DBR stack 410 has an odd number of layers. The reflectivity of the DBR stack 111 depends, in part, on the number of layers and the refractive index ("n") of the materials used. The alternating layers can be, for example: $SiO_2$ (n=1.5) and $TiO_2$ (n=2.45); or $SiO_2$ and $Si_xN_y$; or $SiO_2$ and $SiN_x$.

In accordance with the invention, the top surface of first electrode 411 (in a bottom-emitting device) is modified to create lens-likes features thereon. The lens-like features will channel more light into the DBR stack 410 and thus improve light emission. In one embodiment the total thickness of the DBR stack may be about 360 nm for instance, in the case of a 5 layer stack (58 nm/95 nm/58 nm/95 nm/58 nm).

First Electrode 411:

In one configuration where a bottom-emitting device is desired, the first electrode 411 functions as an anode (the anode is a conductive layer which serves as a hole-injecting layer and which comprises a material with work function greater than about 4.5 eV). Typical anode materials include metals (such as platinum, gold, palladium, indium, and the like); metal oxides (such as lead oxide, tin oxide, ITO (Indium Tin Oxide), and the like); graphite; doped inorganic semiconductors (such as silicon, germanium, gallium arsenide, and the like); and doped conducting polymers (such as polyaniline, polypyrrole, polythiophene, and the like). In one embodiment of the invention, ITO is used as the first electrode 411. ITO has a refractive index (n) equal to about 1.8.

The first electrode 411 can be transparent, semi-transparent, or opaque to the wavelength of light generated within the device 405. The thickness of the first electrode 411 can be from about 10 nm to about 1000 nm, preferably, from about 50 nm to about 200 nm, and more preferably, is about 100 nm. The first electrode layer 411 can typically be fabricated using any of the techniques known in the art for deposition of thin films, including, for example, vacuum evaporation, sputtering, electron beam deposition, or chemical vapor deposition.

For a bottom-emitting OLED, the first electrode 411 is an anode layer and will be transparent, or semi-transparent or translucent. The first electrode 411 has two surfaces, a first which is adjacent to the substrate 408, and a second which is adjacent to the layer (such as planarizing layer 412) which is to be deposited over it. In accordance with the invention, the second surface of first electrode 411 is modified to include lens-like features thereon. The features can be fabricated by cutting, scraping or otherwise serrating the surface after the material for forming the first electrode 411 has been deposited on the DBR stack 410. The features can have a height (which can be non-uniform from feature to feature) of about between 0 and 1000 nm, preferably about 500 nm or less and be of various width and shape. Further, the geometry of the features can be any geometry that will create the desired effect of changing the angles of incidence of light within the device.

The features may also be fabricated by patterning the first electrode 411 after the electrode material is laid down on the DBR stack 410. The patterning can be achieved by etching, wet-etching, lithography, e-beam lithography, stamping, or sputtering. Differences in density and height of the features created will vary the light output. The selection and design of the features density and height will depend upon the desirable characteristics of light which is being output by the LEP 420 (see below). In general, it is preferable to have more dense features than less dense features so that more emitted light from the EL layer is projected out. The height of the lens-like features being created should be in the same order as the wavelength of the emitted light e.g. from a $\frac{1}{100}^{th}$ to 1 times the wavelength of light, and preferably from $\frac{1}{10}^{th}$ to 1 times the wavelength light.

Planarizing Layer 412

In order to provide a flat deposition surface for organic and other layers deposited above the first electrode 411, a planarizing layer 412 is fabricated. The planarizing layer 412 fills in the cavities and crevices created by the inclusion of features n the surface of the first electrode 411. The planarizing layer should be index matched with the HIL layer. In one embodiment, the planarizing layer 412 is the polymer used as HIL allowing light to pass unobstructed and without internal reflection from the HIL layer to the planarizing layer.

HIL 417

The HIL 417 has good hole conducting properties and is used to effectively inject holes from the first electrode 411 to the EL 420. The HIL 417 can be fabricated from polymers or small molecule materials. The hole injection layer usually consists of a conductive polymer with polymeric acid dopant. Examples of conductive polymers include polypyrrole, polythiophene, polyaniline, etc. For example, the HIL 417 can be fabricated from tertiary amine or carbazole derivatives both in their small molecule or their polymer form, conducting polyaniline ("PANI"), or PEDOT:PSS (a solution of poly(3, 4-ethylenedioxythiophene) ("PEDOT") and polystyrenesulfonic acid ("PSS") available as Baytron P from HC Starck). The HIL 417 can have a thickness from about 5 nm to about 1000 nm, and is conventionally used from about 50 nm to about 250 nm. The HIL 417 has a refractive index of about 1.56 when PEDOT:PSS is used in its fabrication. Other examples of the HIL 417 include any small molecule materials and the like such as plasma polymerized fluorocarbon films (CFx) with preferred thicknesses between 0.3 and 3 nm, copper phthalocyanine (CuPc) films with preferred thicknesses between 10 and 50 nm.

The HIL 417 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole injecting and/or buffer material is deposited on the first electrode 411 and then allowed to dry into a film. The dried film represents the HIL 417. Other deposition methods for the HIL 417 include plasma polymerization (for CFx layers), vacuum deposition, or vapour phase deposition (e.g. for films of CuPc).

EL Layer 420:

For organic LEDs (OLEDs), the EL layer 420 contains at least one organic material that emits light. These organic light emitting materials generally fall into two categories. The first category of OLEDs, referred to as polymeric light emitting diodes, or PLEDs, utilize polymers as part of EL layer 420. The polymers may be organic or organo-metallic in nature. As used herein, the term organic also includes organo-metallic materials. Preferably, these polymers are solvated in an organic solvent, such as toluene or xylene, and spun (spin-coated) onto the device, although other deposition methods are possible. Devices utilizing polymeric active electronic materials in EL layer 420 are especially preferred. Optionally, EL layer 420 may include a light responsive material that changes its electrical properties in response to the absorption of light. Light responsive materials are often used in detectors and solar panels that convert light energy to electrical energy.

The light emitting organic polymers in the EL layer 420 can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, the organic polymers can be, for example: polyfluorenes; poly-p-phenylenevinylenes that emit white, red, blue, yellow, or green light and are 2-, or 2,5-substituted poly-p-pheneylenevinylenes; polyspiro polymers. Other polymers include polyspirofluorene-like polymers.

In addition to polymers, smaller organic molecules that emit by fluorescence or by phosphorescence can serve as a light emitting material residing in EL layer 420. Unlike polymeric materials that are applied as solutions or suspensions, small-molecule light emitting materials are preferably deposited through evaporative, sublimation, or organic vapor phase deposition methods. Combinations of PLED materials and smaller organic molecules can also serve as active electronic layer. For example, a PLED may be chemically derivatized with a small organic molecule or simply mixed with a small organic molecule to form EL layer 420.

In addition to organic materials that emit light, EL layer 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used. EL layer 420 may also include semiconductors, such as silicon or gallium arsenide. The EL layer 420 typically has a thickness of greater than 80 nm and preferably, between 40 and 125 nm.

Any or all of the above-mentioned layers such as HIL 417 and EL layer 420 can be ink-jet printed by depositing an organic solution or by spin-coating, or other deposition techniques. This organic solution may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops. Further, each of the layers 417 and 420 may be cross-linked or otherwise physically or chemically hardened as desired for stability and maintenance of certain surface properties desirable for deposition of subsequent layers.

Second Electrode (423)

In one embodiment, second electrode 423 functions as a cathode when an electric potential is applied across the first electrode 411 and second electrode 423. In this embodiment, when an electric potential is applied across the first electrode 411, which serves as the anode, and second electrode 423, which serves as the cathode, photons are released from EL layer 420 that pass through first electrode 411 and substrate 408.

While many materials, which can function as a cathode, are known to those of skill in the art, most preferably a composition that includes aluminum, indium, silver, gold, magnesium, calcium, and barium, or combinations thereof, or alloys thereof, is utilized. Aluminum, aluminum alloys, and combinations of magnesium and silver or their alloys can also be utilized.

Preferably, the thickness of second electrode 423 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as physical vapor deposition (PVD) are preferred. Other layers (not shown) such as a barrier layer and getter layer may also be used to protect the electronic device. Such layers are well-known in the art and are not specifically discussed herein.

Figure 3:
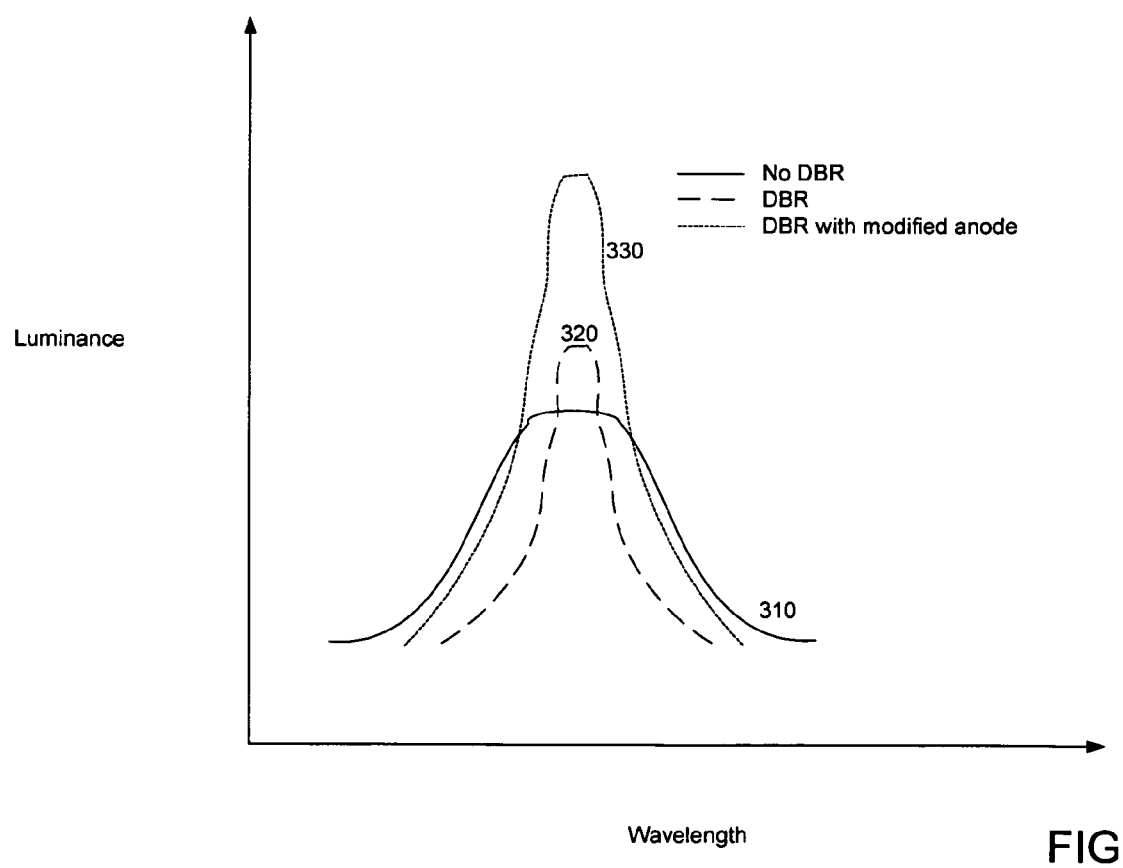
FIG. 3 illustrates exemplary emission spectrums of different types of OLED devices including at least on embodiment of the invention.

FIG. 3 illustrates exemplary emission spectrums of different types of OLED devices including at least on embodiment of the invention. Curve 310 is an emission spectrum of a typical OLED device without any DBR stack and a flat, unmodified anode layer. Curve 320 is an emission spectrum of a typical OLED device with a DBR stack and a flat, unmodified anode layer. The spectra is slightly broader at lower luminosities but the peak luminance is lower compared to that of curve 320. The DBR stack in curve 320 has the effect of amplifying the luminous intensity, or in other words, delivering more light output at a particular wavelength. The length and composition of the DBR stack will determine the level of amplification (A). The third curve 330 is exemplary of an emission spectrum produced by an OLED device with a DBR stack similar/identical to the device of curve 320 but additionally including a planarizing layer and a modified anode surface made to purposely contain lens-like features. The lens-like features also have an amplifying effect upon the peak luminance at the resonant wavelength. Assume that the peak luminance of curve 310 is L, and the amplification due to the DBR stack in curve 320 is A. Also, assume that the lens-like features of the modified anode produce a further amplification effect K. The peak luminance then, of the device of curve 330 is L*A*K. The emission spectrum is narrower in the device of curve 330 than the device of curve 320. Where a specific color light output is more desirable, the effect of a narrower spectrum will be negligible if any. Further, both the amplification factors and the resonant wavelengths can be specifically designed as suits the desired light output characteristics.

Figure 4:
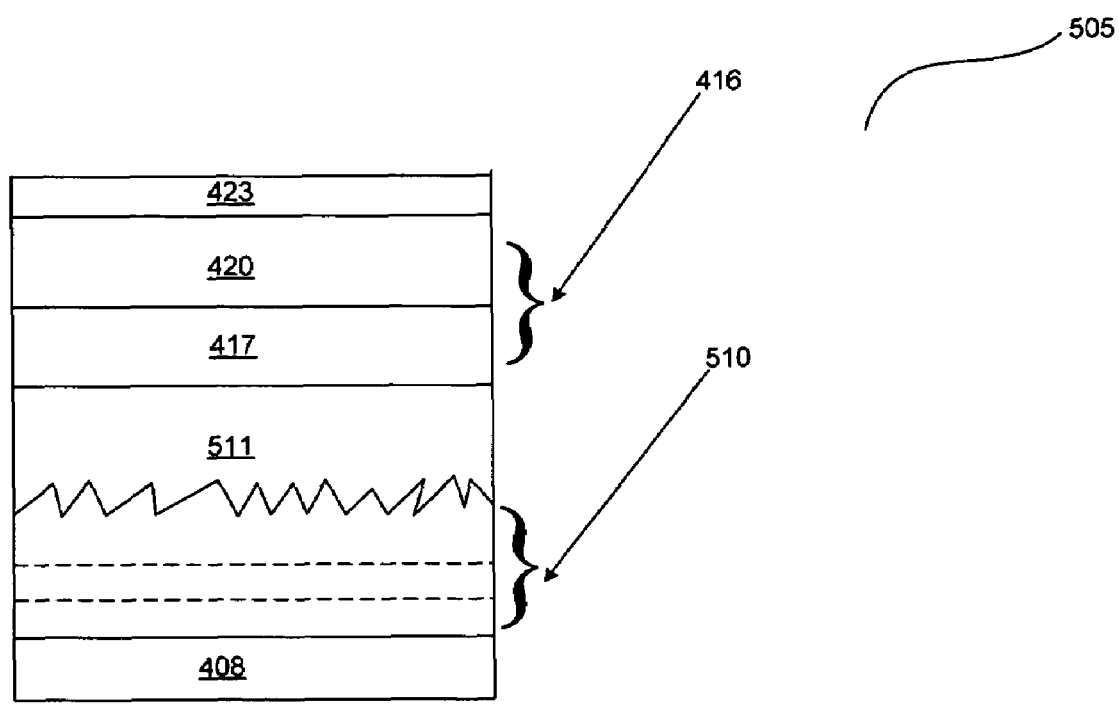
FIG. 4 shows a cross-sectional view of an embodiment of an OLED device 505 according to at least one embodiment of the invention.

FIG. 4 shows a cross-sectional view of an embodiment of an OLED device 505 according to at least one embodiment of the invention. The OLED device 505 is identical or similar in all respects to OLED device 405 described above, with like-numbered elements being identical, except as discussed below.

DBR Stack 510

DBR stack 510 is similar to DBR stack 410 described above except that the top surface (the surface not adjacent to the substrate 408) of DBR stack 510 is serrated or otherwise modified to create lens-like features thereon. The lens-like features on DBR stack 510 have a similar form and function to lens-like features created on the top surface of first electrode 411 shown above.

First Electrode 511

First electrode 511 is similar to first electrode 411 in all aspects except that the top surface is not modified. In the absence of a planarizing layer above DBR stack 510, the first electrode 511 can act as a planarizing layer. Since the first electrode 511 is typically inorganic, a variety of deposition methods can be used to fill-in the apertures and gaps created by the presence of lens-like features on DBR stack 510, and thus act to planarize. The top surface of first electrode 511 (the surface not adjacent to DBR stack 510) is flat and uniform or substantially so such that the organic stack 416 can be effectively and properly fabricated. In an alternative embodiment of the invention, a planarizing layer similar to planarizing layer 412 can be added between DBR stack 510 and first electrode 511.

While the embodiments of the invention are illustrated in which it is primarily incorporated within an OLED device, almost any type of electroluminescent device may be potential applications for these embodiments. The OLED device described earlier can be used within displays in applications such as, for example, computer displays, information displays in vehicles, television monitors, telephones, printers, and illuminated signs and for general and area lighting.

What is claimed is:

1. An organic light emitting device, comprising:
a substrate;
a distributed Bragg reflector (DBR) stack on said substrate;
an anode layer on said DBR stack wherein said anode layer is modified by creating lens-like features, said lens-like features not adjacent to said DBR stack; and
a planarizing layer on said anode layer, said planarizing layer filling in said lens-like features, said planarizing layer providing a flat uniform surface for deposition of other layers thereupon.

2. The device according to claim 1 wherein said lens-like features are created by serrating a surface of said anode layer which is not adjacent to said DBR stack.

3. The device according to claim 1 further comprising:
a hole injection layer on said planarizing layer; and
an electro-luminescent layer on said hole injection layer, said electro-luminescent layer outputting light upon exciton formation therein.

4. The device according to claim 1 wherein said DBR stack comprises a plurality of substantially non-absorbing materials, said DBR stack capable of amplifying a luminance of at least some wavelengths of light emitted from said device.

5. The device according to claim 1 wherein said lens-like features are capable of amplifying a luminance of at least some wavelengths of light emitted from said device.

6. The device according to claim 1 wherein said planarizing layer is transparent.

7. The device according to claim 2 wherein a serrating pattern is random.

8. The device according to claim 1 wherein said lens-like features are created by patterning a surface of said anode layer which is not adjacent to said DBR stack.

9. The device according to claim 8 wherein patterning includes at least one of: dry etching, wet etching, lithography, stamping or sputtering.

10. The device according to claim 5 wherein the height of the lens-like features is between 1% and 100% of any particular wavelength of light to be amplified.

11. A method of fabricating an organic light emitting diode device, said method comprising:
fabricating a distributed Bragg reflector (DBR) stack on a substrate;

fabricating an anode layer on said DBR stack wherein said anode layer is modified by creating lens-like features, said lens-like features not adjacent to said DBR stack; and fabricating a planarizing layer on said anode layer, said planarizing layer filling in said lens-like features, said planarizing layer providing a flat uniform surface for deposition of other layers thereupon.

12. The method of claim 11 wherein creating lens-like features includes:

serrating a surface of said anode layer that is not adjacent to said DBR stack.

13. The method of claim 11 further comprising:

fabricating a hole injection layer on said planarizing layer; and fabricating an electro-luminescent layer on said hole injection layer, said electro-luminescent layer outputting light upon exciton formation therein.

14. The method of claim 11 wherein said DBR stack comprises a plurality of substantially non-absorbing materials, said DBR stack capable of amplifying the luminance of at least some wavelengths of light emitted from said device.

15. The method of claim 11 wherein said lens-like features are capable of amplifying the luminance of at least some wavelengths of light emitted from said device.

16. The method of claim 11 wherein said planarizing layer is transparent.

17. The method of claim 12 wherein a serrating pattern is random.

18. The method of claim 11 wherein said lens-like features are created by patterning a surface of said anode layer which is not adjacent to said DBR stack.

19. The method of claim 18 wherein patterning includes at least one of: dry etching, wet etching, lithography, stamping or sputtering.

20. An organic light emitting device, comprising:

a substrate;

a distributed Bragg reflector (DBR) stack on said substrate wherein said DBR stack is modified by creating lens-like features, said lens-like features not adjacent to said substrate; and an anode layer on said DBR stack.

21. The device of claim 20 wherein said anode layer acts as a planarizing layer on said DBR stack, said planarizing layer filling in said lens-like features, said planarizing layer providing a flat uniform surface for deposition of other layers thereupon.

22. The device of claim 20 further comprising:

a planarizing layer on said DBR stack, said planarizing layer filling in said lens-like features, said planarizing layer providing a flat uniform surface for deposition of other layers thereupon.

23. The device according to claim 1 wherein said planarizing layer comprises a hole injection layer material.

* * * * *

UNITED STATES PATENT AND TRADEMARK OFFICE
CERTIFICATE OF CORRECTION

| | |
|---|---|
| PATENT NO. | : 7,504,770 B2 |
| APPLICATION NO. | : 11/054997 |
| DATED | : March 17, 2009 |
| INVENTOR(S) | : Vi-En Choong |

It is certified that error appears in the above-identified patent and that said Letters Patent is hereby corrected as shown below:

On the Cover Page, (73) Assignee, replace;

"Osram Opto Semiconductors GmbH, Regensberg (DE)" with
-- Osram Opto Semiconductors GmbH, Regensburg (DE) --

Signed and Sealed this

Nineteenth Day of May, 2009

JOHN DOLL
*Acting Director of the United States Patent and Trademark Office*